(12) United States Patent
Yoneda

(10) Patent No.: US 6,507,088 B2
(45) Date of Patent: Jan. 14, 2003

(54) POWER SEMICONDUCTOR DEVICE INCLUDING VOLTAGE DRIVE TYPE POWER MOS TRANSISTOR

(75) Inventor: Tatsuo Yoneda, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/811,452

(22) Filed: Mar. 20, 2001

(65) Prior Publication Data

US 2001/0023967 A1 Sep. 27, 2001

(30) Foreign Application Priority Data

Mar. 24, 2000 (JP) .......................... 2000-085422

(51) Int. Cl.$^7$ .................. H01L 29/00; H01L 29/861; H01L 31/107
(52) U.S. Cl. ............... 257/551; 257/199; 257/481; 257/603
(58) Field of Search ................ 257/199, 481, 257/551, 603

(56) References Cited

U.S. PATENT DOCUMENTS 3,596,115 A * 7/1971 Conzelmann ............... 307/303
4,404,477 A * 9/1983 Chao .......................... 307/297
5,010,439 A * 4/1991 Zisa et al. ................... 361/91
5,079,608 A * 1/1992 Wodarczyk et al. ..... 357/23.13
5,172,290 A   12/1992 Leipold et al.
5,650,737 A    7/1997 Eilley
5,747,836 A * 5/1998 Mariyama ................... 257/119
6,268,628 B1 * 7/2001 Yoshida et al. ............. 257/341

FOREIGN PATENT DOCUMENTS

JP          9-18001        1/1997

* cited by examiner

Primary Examiner—Jerome Jackson
Assistant Examiner—Jesse A. Fenty
(74) Attorney, Agent, or Firm—Oblon, Spivak, McClelland, Maier & Neustadt, P.C.

(57) ABSTRACT

A power semiconductor device of the present invention comprises a voltage drive type power MOS transistor, a series connection of a first resistor and Zener diode, a second resistor, and a series connection of a third resistor and MOS transistor. The power MOS transistor has a gate, source and drain. A drain-to-source voltage of the power MOS transistor is applied across the series connection of the first resistor and Zener diode. A gate-to-source voltage of the power MOS transistor is applied across the second resistor. The gate-to-source voltage of the power MOS transistor is applied across a series connection of a third resistor and the MOS transistor. The MOS transistor has a gate, source and drain. The gate of the MOS transistor is connected to a node between the first resistor and the Zener diode.

10 Claims, 1 Drawing Sheet

POWER SEMICONDUCTOR DEVICE INCLUDING VOLTAGE DRIVE TYPE POWER MOS TRANSISTOR

This application is based upon and claims the benefit of priority from the prior Japanese Patent Application No. 2000-085422, filed Mar. 24, 2000, the entire contents of which are incorporated herein by reference.

BACKGROUND OF THE INVENTION

The present invention relates to a power semiconductor device and, in particular, to a voltage drive type power MOS field effect transistor (hereinafter referred to as a power MOSFET) used for a power supply.

The voltage drive type power MOSFET is generally used as a switch for motor driving. For example, a switch for a vehicle-mounted ABS (Anti-Lock Braking System) is its typical application.

In a pump motor drive circuit having the above-mentioned power MOSFET, a control IC is generally mounted to the gates of a plurality of such power MOSFETS to control their gate potential. There is sometimes a case where a control IC-built IPD (Intelligent Power Device) or IPM (Intelligent Power Module) is connected to the gate.

Conventionally, in such a circuit arrangement, if the control IC is destroyed for some reason or other or if any inconvenience arises, the gate potential of the MOSFET is brought to a not-fixed state (floating state) and this causes an incomplete ON state. The incomplete ON state is intended to mean that, of a plurality of FET segments, some segment is rendered ON and some segment is not rendered ON.

If these segments are brought to such states, the flow of electric current concentrates onto the ON-state segment, so that the ON-state segment becomes defective due to the occurrence of thermal destruction. If the ON-state segment is thermally destroyed and there occurs a short-circuited state, a full power is applied to a pump motor, thus causing a danger of the motor being destroyed.

Further, the destruction of this segment is less likely to occur in a normal temperature range and, usually, a constant unstable state is continued until a final destruction occurs. This problem should be solved, for example, in a vehicle-mounted application requiring a reliability under the normal and high temperatures.

It may be considered that the adoption of the IPD, IPM, etc., with a simple circuit incorporated therein be made as a solution to this problem.

If, however, the IPD, IPM, etc., are adopted, then a cost performance becomes worse.

BRIEF SUMMARY OF THE INVENTION

The present invention has been achieved with the above-mentioned task in mind and it is accordingly the object of the present invention to provide a power MOSFET-equipped semiconductor device which, without using many component parts and without adopting an IPD, IPM, etc., involving a high cost, incorporates a circuit of a simpler arrangement therein and, by doing so, can prevent the power MOSFET from being thermally destroyed in the case where the gate potential of the power MOSFET is brought to a not-fixed state.

In order to achieve the above-mentioned object, a power semiconductor device according to a first aspect of the present invention comprises a voltage drive type power MOS transistor having a gate, source and drain; a series connection of a first resistor and Zener diode across which a drain-to-source voltage of the power MOS transistor is applied; a second resistor across which a gate-to-source voltage of the power MOS transistor is applied; and a series connection of a third resistor and MOS transistor across which the gate-to-source voltage of the power MOS transistor is applied, the MOS transistor having a gate, source and drain, and the gate of the MOS transistor being connected to a node between the first resistor and the Zener diode.

In order to achieve the above-mentioned object, a power semiconductor device according to a second aspect of the present invention comprises a voltage drive type power MOS transistor having a gate, source and drain and formed on a semiconductor substrate; a series connection of a first resistor and Zener diode across which a drain-to-source voltage of the power MOS transistor is applied, the first resistor and Zener diode being formed on the semiconductor substrate; a second resistor across which a gate-to-source voltage of the power MOS transistor is applied, the second resistor being formed on the semiconductor substrate; and a series connection of a third resistor and MOS transistor across which the gate-to-source voltage of the MOS transistor is applied, the MOS transistor having a gate, source and drain, the gate of the MOS transistor being connected to a node between the first resistor and the Zener diode, and the third resistor and MOS transistor being formed on the semiconductor substrate.

In the power semiconductor device thus structured, a variable resistance circuit is provided between the gate and the source of the power MOS transistor. The variable resistance circuit has the first resistor and Zener diode, second resistor, and third resistor and MOS transistor. By doing so it is possible to prevent a thermal destruction of the power MOS transistor which may occur in the case where the gate potential of the power MOS transistor is brought to a not-fixed state.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be described below with reference to the accompanying drawing.

Figure 1:
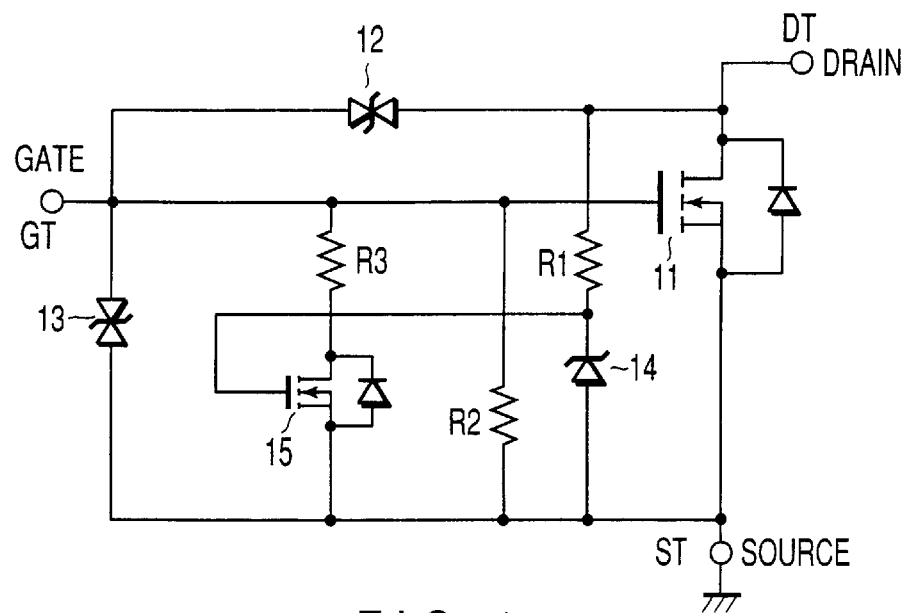
FIG. 1 is a circuit diagram showing an arrangement of a power semiconductor device according to an embodiment of the present invention.

FIG. 1 is a circuit diagram showing an arrangement of a power semiconductor device according to the embodiment of the present invention.

This power semiconductor device comprises an n-channel power MOSFET 11, active clamping diode 12, gate protection diode 13, Zener diode 14, lateral type n-channel MOS field effect transistor (hereinafter referred to an n MOS transistor) 15 and resistors R1, R2, and R3.

A drain terminal DT is connected to the drain of the MOSFET 11, a gate terminal GT is connected to the gate of the MOSFET 11 and a source terminal ST is connected to the source of the MOSFET 11.

The active clamping diode 12 is connected between the drain terminal DT and the gate terminal GT. The resistor R1 and Zener diode 14 are series-connected between the drain terminal DT and the source terminal ST.

The resistor R2 is connected between the gate terminal GT and the source terminal ST. The resistor R3 and n MOS transistor 15 are series-connected between the gate terminal GT and the source terminal ST. The gate protection diode 13 is connected between the gate terminal GT and the source terminal ST. To a junction between the resistor R1 and the Zener diode 14 the gate of the n MOS transistor 15 is connected.

The threshold voltage of the n MOS transistor 15 is lower than 7V. Further, the breakdown voltage (VZ) of the active clamping diode 12 is VZ=33V to 43V. A resistive value of the resistor R1 is about 1 MΩ, a resistive value of the resistor R2 is about 2 MΩ and a resistive value of the resistor R3 is about 20 kΩ to 100 kΩ.

Even if, in this power semiconductor device, an external control IC for controlling the gate potential of the MOSFET 11 is destroyed and the gate of the MOSFET 11 is brought to a floating state, unless the MOSFET 11 is driven, the above-mentioned problem, that is, the destruction of the MOSFET 11 can be solved. In the present embodiment, therefore, a variable resistance means is connected to the gate to set the gate-to-source resistive value of the MOSFET 11 variable.

An explanation will be made below about the circuit operation by taking a vehicle-mounted ABS pump motor driving switch by way of example.

First, an explanation will be made below about the operation when the external control IC for controlling the gate potential of the MOSFET 11 is destroyed and the gate potential of the MOSFET 11 is brought to a floating state.

In the above-mentioned switch, when the MOSFET 11 is turned ON, a battery voltage of 14V is applied across the drain and the source. When the MOSFET 11 is turned ON, that is, the gate potential is larger than the threshold voltage of the MOSFET 11, if the gate is brought to a floating state, the following occurs.

At this time, a current of 7 μA flows through the resistor R1 and Zener diode 14. It is to be noted that the resistive value of the resistor R1 is about 1 MΩ and that the breakdown voltage (VZ) of the Zener diode 14 is 7V. A voltage of 7V is generated at the junction between the resistor R1 and the Zener diode 14.

When the voltage on the above-mentioned junction is applied to the gate of the n MOS transistor 15, the n MOS transistor 15 is turned ON because the threshold voltage of the n MOS transistor 15 is lower than 7V. By doing so, a current flows through the resistor R3 connected between the gate terminal GT and the source terminal ST. The resistive value of the resistor R3 is about 20 kΩ to 100 kΩ and low.

For this reason, the gate potential of the MOSFET 11 is lowered so that the gate potential is fixed to below the threshold voltage of the MOSFET 11. In the case where the gate of the MOSFET 11 is brought to the floating state, it is possible to prevent the MOSFET 11 from being turned ON due to a very small current.

Then an explanation will be made below about the operation when the gate potential of the MOSFET 11 is controlled by the control IC to turn the MOSFET 11 ON.

When the gate potential is above the threshold voltage of the MOSFET 11, a current flows through a resistor R2 connected between the gate terminal GT and the source terminal ST. The resistive value of the resistor R2 is 2 MΩ and high. For this reason, the gate potential of the MOSFET 11 is not lowered and is fixed to a voltage higher than the threshold voltage. By doing so, in the case where the gate potential of the MOSFET 11 is controlled to turn the MOSFET 11 ON, the MOSFET 11 can be turned ON by a very small current.

In the present embodiment, as explained above, a circuit of a simpler arrangement is incorporated into a power MOSFET-equipped semiconductor device without largely increasing the number of component parts and without adopting any IPD, IPM, etc., involving a high cost. By doing so, the power MOSFET can be prevented from being thermally destroyed in the case where the gate potential of the power MOSFET is brought to a not-fixed state.

Now an explanation will be made below about a structure of the MOSFET 11 and lateral type n MOS transistor 15 in the power semiconductor device of the present invention.

Figure 2:
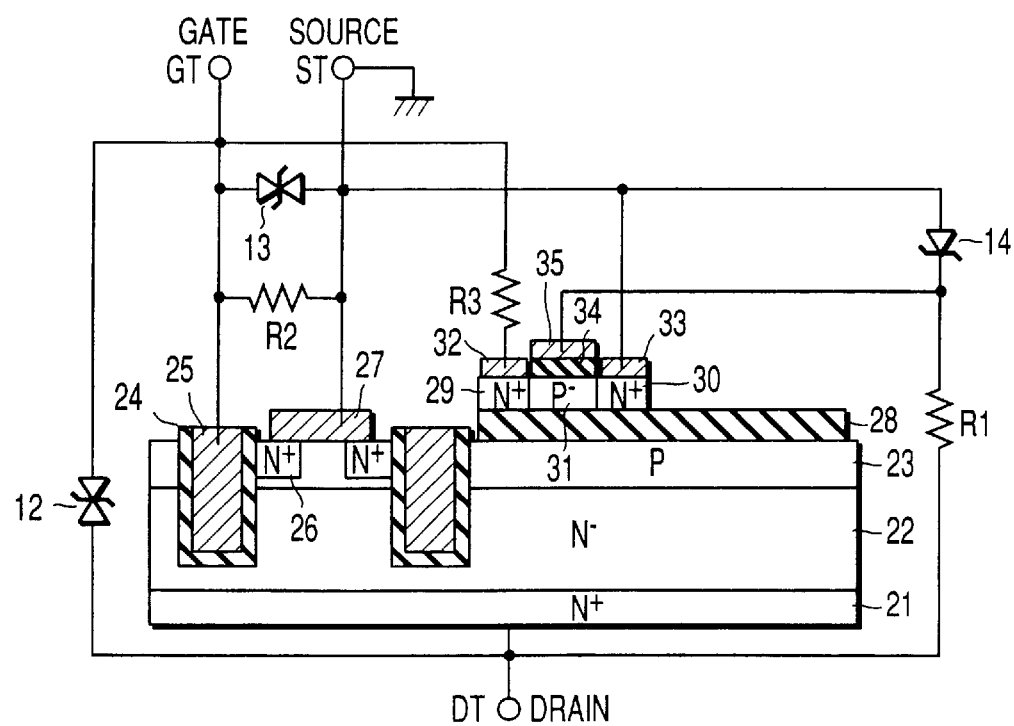
FIG. 2 is a cross-sectional view showing a structural model of a power MOSFET and lateral type n-channel MOS transistor in the power semiconductor device according to the embodiment of the present invention.

FIG. 2 is a cross-sectional view showing a structure model of the MOSFET 11 and n MOS transistor 15. Here, as the MOSFET 11 use is made of a trench type.

As shown in FIG. 2, an n⁻ type epitaxial layer 22 is formed on one surface of an n⁺ type semiconductor substrate 21. A p type base layer 23 is formed on the n⁻ type epitaxial layer 22.

A trench is formed in the n⁻ type epitaxial layer 22 and p type base layer 23. A gate insulating film 24 and gate 25 are formed in the trench. A gate terminal GT is connected to the gate 25. For example, a silicon oxide film is used as the gate insulating film 24 and a polysilicon is used as the gate 25.

Two n⁺ type source layers 26 are formed in the p type base layer 23 in the neighborhood of the gate insulating film 24 at an area sandwiched between the two gates 25. A source electrode 27 is formed on the n⁺ type source layers 26. A grounded source terminal ST is connected to the source electrode 27. For example, as the source electrode 27 use is made of a metal such as Al. The structure as set out above constitutes the MOSFET 11.

The above-mentioned lateral type n MOS transistor 15 has the following structure. A silicon oxide film (such as SiO₂) 28 is formed on the p type base layer 23. An n⁺ type drain layer 29, n⁺ type source layer 30 and p⁻ type layer 31 are formed on the silicon oxide film 28. As the n⁺ type drain layer 29, n⁺ type source layer 30 and p⁻ type layer 31 use is made of polysilicon.

A drain electrode 32 is formed on the n⁺ type drain electrode 29. One end of a resistor R3 is connected to the drain electrode 32. A source electrode 33 is formed on the n⁺ type source layer 30. A source terminal ST is connected to the source electrode 33. As the drain electrode 32 and source electrode 33, for example, use is made of a metal such as Al.

A gate insulating film (such as SiO₂) 34 is formed on the p⁻ type layer 31 and a gate electrode 35 is formed on the gate insulating film 34. A junction between the resistor R1 and the Zener diode 14 is connected to the gate electrode 35. As the gate electrode 35, for example, use is made of a metal such as aluminum. A drain terminal DT is connected to the n+ type semiconductor substrate 21. The other connection is the same as that as shown in FIG. 1.

In the present embodiment, as set out above, the lateral type n MOS transistor 15 for switching a resistive value of a variable resistance circuit is provided between the gate and the source of the power MOSFET 11. A semiconductor layer (active layer) for creating a channel of the n MOS transistor 15 is formed using a polysilicon (p− type layer 31) on the silicon oxide film 28. This arrangement obviates the necessity of using the element isolation technique, etc., and ensures a simpler circuit structure.

It is experimentally confirmed that, even if the potential on the p− type region 31 of the n MOS transistor 15 is not fixed, the n MOS transistor 15 operates.

The present invention is characterized by the variable resistance circuit which makes the gate-to-source resistance value smaller when a voltage applied to the gate of the power transistor is below the threshold voltage and makes the gate-to-source resistance value larger when the voltage applied to the above-mentioned gate is higher than the threshold voltage.

When, therefore, a gate potential of the voltage drive type power transistor cannot be arbitrarily fixed, such as when a gate potential controlling IC fails to operate or when the gate is opened, the above-mentioned variable resistance circuit functions as a protection circuit for preventing the power transistor from being destroyed.

Further, by forming the lateral type n MOS transistor, that is, a transistor for a switch for switching a resistive value of the variable resistance circuit, with the use of a polysilicon, it is possible to simplify the structure of this variable resistance circuit.

In a motor driving circuit application using a multiple voltage drive type power transistor structure, when a gate potential of a given power transistor is brought to a floating state, it is possible to prevent a thermal destruction caused by the flowing of excess current through a power transistor.

According to the present invention, as set out above, without using many component parts and without adopting the IPD, IPM, etc., involving a high cost, a circuit of a simpler structure is incorporated into a power MOSFET-equipped semiconductor structure and, by doing so, it is possible to provide a semiconductor device having a power MOSFET which can prevent the power MOSFET from being thermally destroyed when the gate potential of the power MOSFET is brought to a not-fixed state.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power semiconductor device comprising:

a voltage drive type power MOS transistor having a gate, source and drain;

a series connection of a first resistor and Zener diode across which a drain-to-source voltage of the power MOS transistor is applied;

a second resistor across which a gate-to-source voltage of the power MOS transistor is applied; and a series connection of a third resistor and MOS transistor across which the gate-to-source voltage of the power MOS transistor is applied, the MOS transistor having a gate, source and drain, the gate of the MOS transistor being connected between the first resistor and the Zener diode.

2. A power semiconductor device according to claim 1, wherein the third resistor is lower in resistive level than the second resistor.

3. A power semiconductor device according to claim 1, further comprising a gate protection diode across which the gate-to-source voltage of the power MOS transistor is applied.

4. A power semiconductor device comprising:

a voltage drive type power MOS transistor formed on a semiconductor substrate and having a gate, source and drain;

a series connection of a first resistor and Zener diode across which a drain-to-source voltage of the power MOS transistor is applied, the first resistor and Zener diode being formed on the semiconductor substrate;

a second resistor across which a gate-to-source voltage of the power MOS transistor is applied, the second resistor being formed on the semiconductor substrate; and a series connection of a third resistor and MOS transistor across which the gate-to-source voltage of the power MOS transistor is applied, the MOS transistor having a gate, source and drain, the gate of the MOS transistor being connected to a node between the first resistor and the Zener diode, and the third resistor and MOS transistor being formed on the semiconductor substrate.

5. A power semiconductor device according to claim 4, wherein the third resistor is lower in resistive level than the second resistor.

6. A power semiconductor device according to claim 4, further comprising a gate protection diode across which the gate-to-source voltage of the power MOS transistor is applied.

7. A power semiconductor device according to claim 4, wherein said power MOS transistor is comprised of a vertical type transistor having its drain and source arranged in a vertical direction relative to the semiconductor substrate and said MOS transistor is comprised of a lateral type transistor having its drain and source arranged in a horizontal direction relative to the semiconductor substrate.

8. A power semiconductor device according to claim 7, wherein a semiconductor layer where a channel of said MOS transistor is created is formed of a polysilicon.

9. A power semiconductor device according to claim 8, wherein said polysilicon is formed on a surface of an insulating film.

10. A power semiconductor device according to claim 9, wherein said insulating film is formed of a silicon oxide film.

* * * * *